United States Patent
Zhang et al.

(10) Patent No.: US 7,255,745 B2
(45) Date of Patent: *Aug. 14, 2007

(54) IRIDIUM OXIDE NANOWIRES AND METHOD FOR FORMING SAME

(75) Inventors: Fengyan Zhang, Vancouver, WA (US); Robert A. Barrowcliff, Vancouver, WA (US); Sheng Teng Hsu, Camas, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 371 days.

This patent is subject to a terminal disclaimer.

(21) Appl. No.: 10/971,330

(22) Filed: Oct. 21, 2004

(65) Prior Publication Data

US 2006/0086314 A1     Apr. 27, 2006

(51) Int. Cl.
    *C30B 29/62* (2006.01)
(52) U.S. Cl. .......................... 117/94; 117/89; 117/95; 117/96; 977/762; 977/763; 977/811
(58) Field of Classification Search ................ 117/94, 117/95, 96, 89; 977/762, 763, 811
See application file for complete search history.

(56) References Cited

U.S. PATENT DOCUMENTS 7,098,144 B2 *  8/2006  Zhang et al. ............... 438/734

OTHER PUBLICATIONS

Yi Cui and Charles M. Lieber, Science, 291 (2001) 851 (Si nano wire for computing).
Lincoln J. Lauhon, Mark S. Gudlksen, Deli Wang, and Charles M. Leiber, Nature, 420 (2002) 57 (Ge).
Jiafang Wang, Mark S. Gudiksen, Xiangfang Duan, Yi Cui, Charles M. Lieber, Science. 293 (2001) 1455 (InP).
Zhaohui Zhong, Fang Qian, Deli Wang, and Charles M. Lieber, Nano Letter, 3 (2003) 344 (GaN).
Zhaohui Zhong, Deli Wang, Yi Cui, Marc W. Bockrath, Charles M. Lieber, Science 302 (2003) 1377 (nano computing).
M. Vazquez, K. Pirota, M. Hernandez-Velez, V.M. Prida, D. Navas, R. Sanz, and F. Batallan, J. Appl. Phys. 95 (2004) 6642 (Ni with template).
B. Erdem Alaca, Huseyin Sehitoglu, and Taher Saif, . Appl. Phys. Lett. 84 (2004) 4669 (Ni in crack).
C.A. Decker, R. Solanki, J.L. Freeouf, and J.R. Carruthers, D.R. Evans, Appl. Phys. Lett. 84 (2004) 1389 (NiSi).

(Continued)

*Primary Examiner*—Robert Kunemund
(74) *Attorney, Agent, or Firm*—Law Office of Gerald Maliszewski; Gerald Maliszewski

(57) ABSTRACT

Iridium oxide (IrOx) nanowires and a method forming the nanowires are provided. The method comprises: providing a growth promotion film with non-continuous surfaces, having a thickness in the range of 0.5 to 5 nanometers (nm), and made from a material such as Ti, Co, Ni, Au, Ta, polycrystalline silicon (poly-Si), SiGe, Pt, Ir, TiN, or TaN; establishing a substrate temperature in the range of 200 to 600 degrees C.; introducing oxygen as a precursor reaction gas; introducing a (methylcyclopentadienyl)(1,5-cyclooctadiene) iridium(I) precursor; using a metalorganic chemical vapor deposition (MOCVD) process, growing IrOx nanowires from the growth promotion film surfaces. The IrOx nanowires have a diameter in the range of 100 to 1000 Å, a length in the range of 1000 Å to 2 microns, an aspect ratio (length to width) of greater than 50:1. Further, the nanowires include single-crystal nanowire cores covered with an amorphous layer having a thickness of less than 10 Å.

51 Claims, 8 Drawing Sheets

OTHER PUBLICATIONS

T.C. Wong, C.P. Li, R.Q. Zhang, and S.T. Lee , Appl. Phys. Lett. 84 (2004) 407 (Au template with Au nano particles).

Oguzhan Gurlu, Omer A. O. Adam, Harold J.W. Zandvliet, and Bene Poelsema, Appl. Phys. Lett, 83 (2003) 4610 (Pt nano wire).

Q. Wan, C. L. Lin, X.B. Yu, and T.H. Wang, Appl. Phys. Lett. 84 (2004) 124 (ZnO).

Michael H. Huang, Samuel Mao, Henning Feick, Haoquan Yan, Yiying Wu, Hannes Kind, Eicke Weber, Richard Russo, Peidong Yang, Science. 292 (2001) 1897 (ZnO).

F. Maury, F. Senocq, Surface and Coatings Technology, 163-164 (2003) 208.

J. P. Endle, Y.-M. Sun, N. Nguyen, S. Madhukar, R.L. Hance, J.M. White, J.G. Ekerdt, Thin Solid Films, 388 (2001) 126.

Reui-San Chen, Yi-Sin Chen, Ying-Sheng Huang, Yao-Lun Chen, Yun Chi, Chao-Shiuan Liu, Kwong-Kau Tiong, and Arthur J. Carty, Chem. Vap. Deposition, 9 (2003), 301.

* cited by examiner

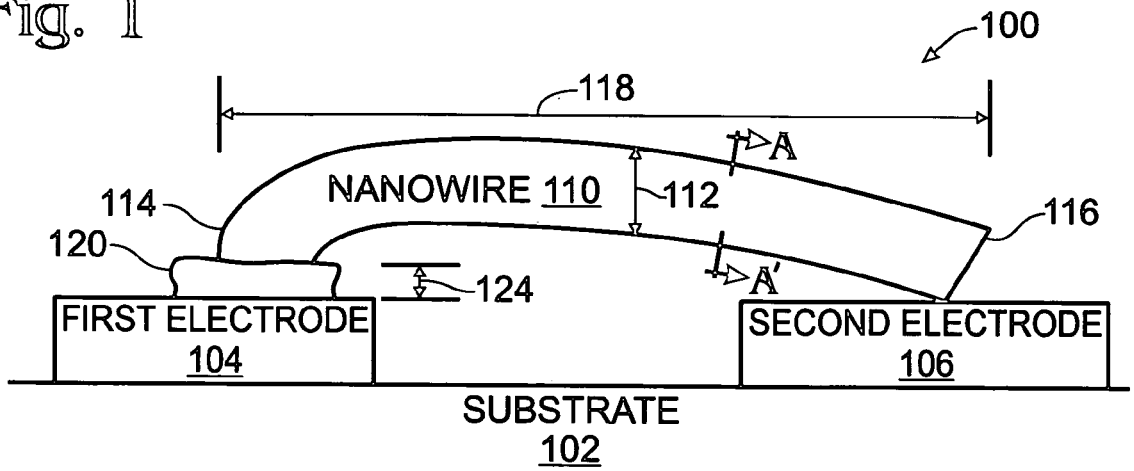
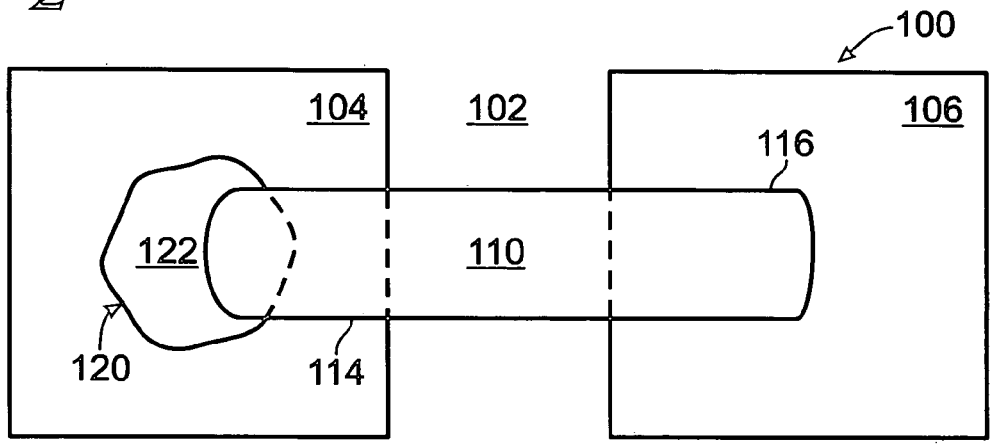
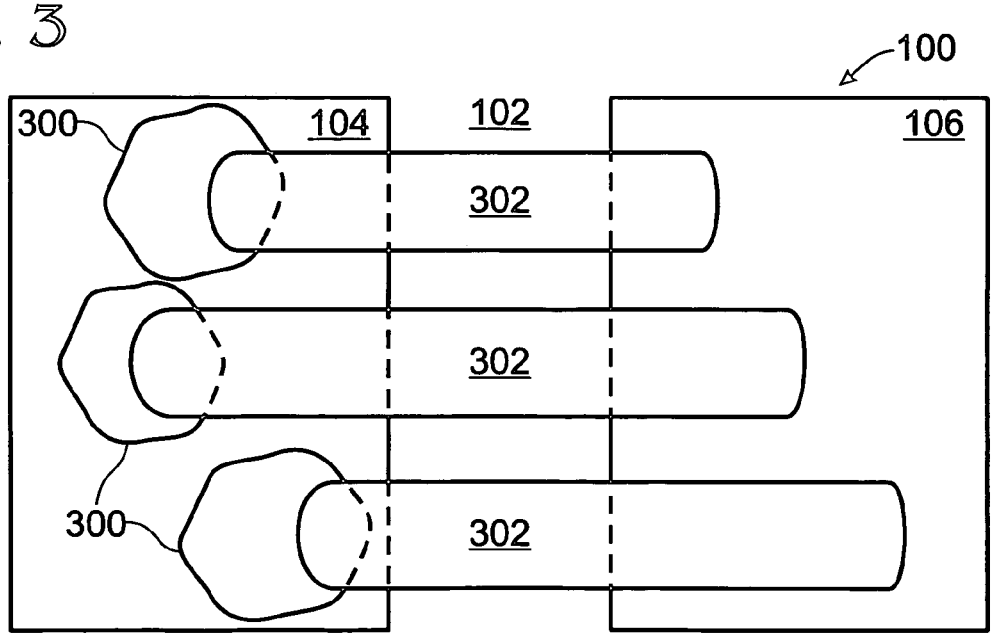

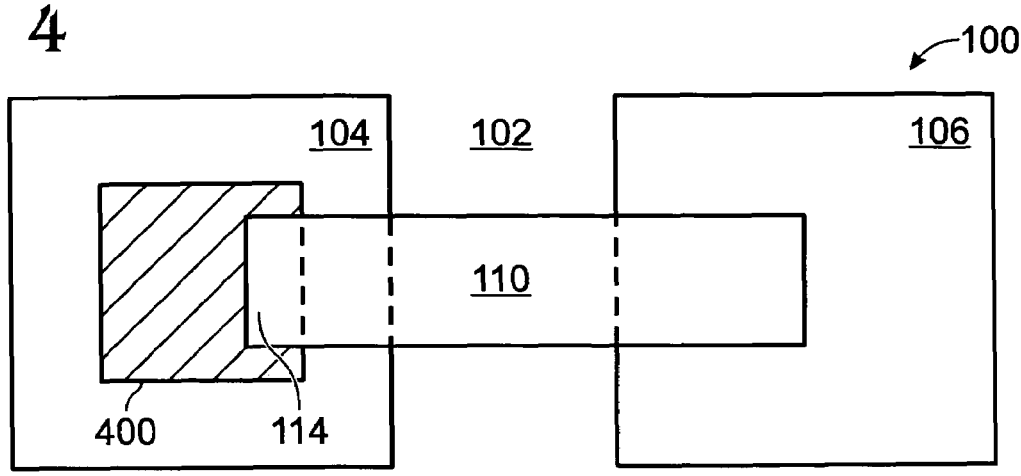
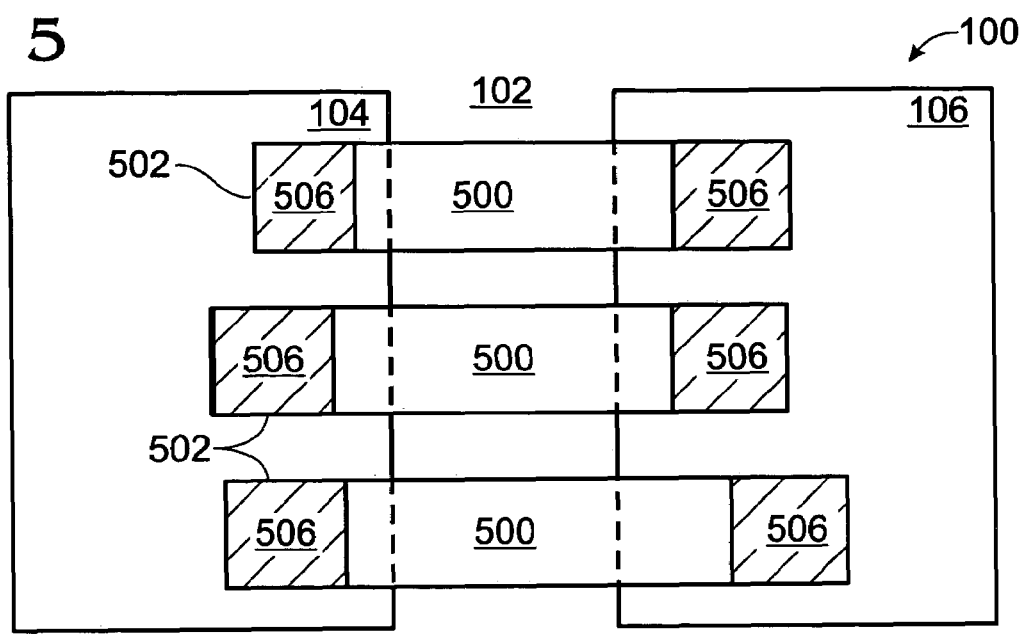
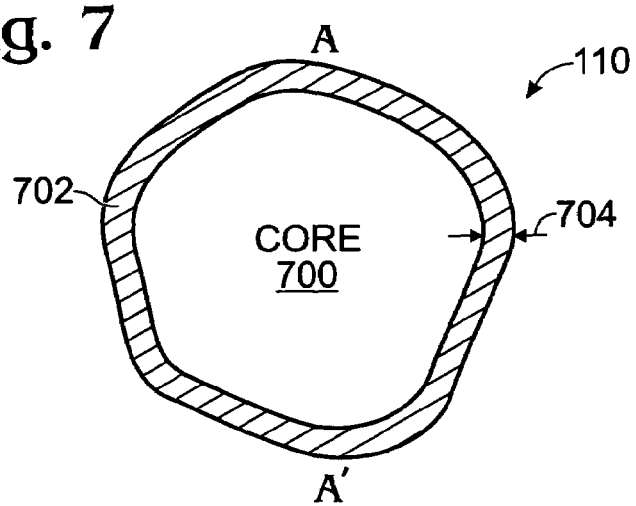

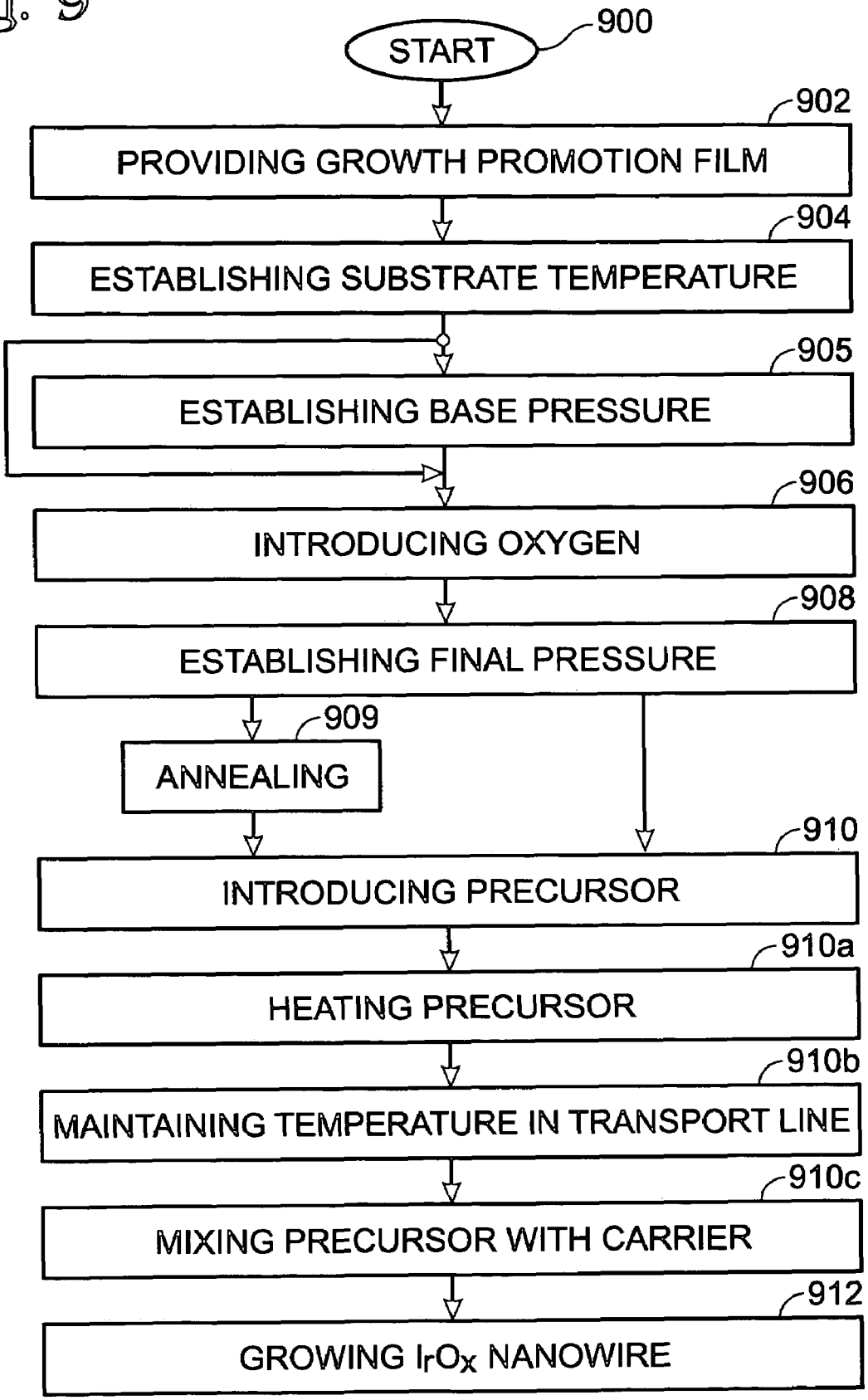

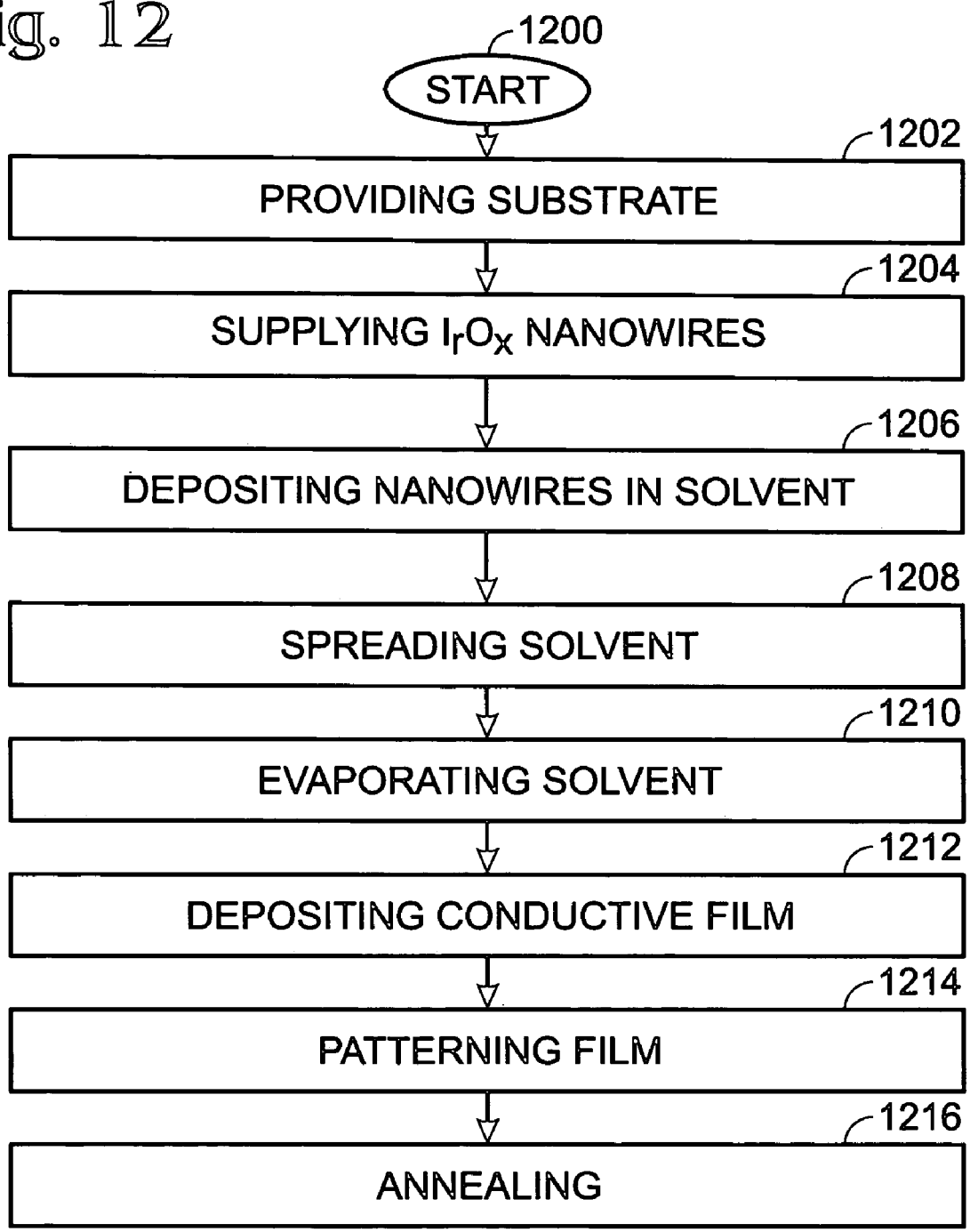

IRIDIUM OXIDE NANOWIRES AND METHOD FOR FORMING SAME

BACKGROUND OF THE INVENTION

1. Field of the Invention

This invention generally relates to integrated circuit (IC) fabrication and, more particularly, to a method for forming iridium oxide nanowires and nanowire electrical interconnections.

2. Description of the Related Art

Recently, the fabrication of nanowires has been explored, due to its potential importance as a building block in nano, microelectromechanical (MEM), and nanoelectromechanical NEM device applications. For example, researchers associated with Charles Lieber have reported the synthesis of a variety of semiconductor nanowires made from materials such as silicon (Si), Si-germanium (SiGe), InP, and GaN, and use in building nano-computing system. Other groups also reported using templates structures to grow metallic nanowires made of materials such as Ni, NiSi, Au, and Pt. Metallic nanowires can be used as interconnections and the sharp tips of the nanowire make them effective for field emission purpose. $ZnO_2$ nanowires are potentially useful as a light emission element.

However, no processes have been reported that are able to form metallic nanowires without the use of porous material forms or templates. The templates add a considerable degree of complexity to the process. Thus, a more practical and commercially feasible means of forming metallic nanowires publications is desirable. It would be especially useful if iridium oxide ($IrO_2$) nanowire could be grown using a metalorganic chemical vapor deposition (MOCVD) methods without a template. $IrO_2$ is a conductive metal oxide that is already widely used in DRAM and FeRAM applications. $IrO_2$ can be used as a conductive electrode, as it has stable electrical and chemical properties, even at high temperature $O_2$ ambient conditions. $IrO_2$ can also be used as pH sensor material. Ir thin film can be deposited using PVD easily with excellent polycrystalline structure and strong (111) orientation. $IrO_2$ can be formed afterwards, by oxidizing the Ir film, or it can be formed directly using reactive sputtering method at higher temperatures in oxygen ambient. CVD methods have recently been developed to grow Ir and $IrO_2$ thin films. It is relatively easy to maintain good composition control in CVD processes, and the method is know to provide good step coverage.

Reui-San Chen et al. have published a paper that discusses making $IrO_2$ nanorods using MOCVD and (methylcyclopentadienyl) (1,5-cyclooctadiene)iridium (I) as precursor. They also explored the potential of using $IrO_2$ nanorods for field emission applications. The nanorods they grew were a few microns long and around 100 nanometers (nm) in diameter. However, successfully repeated experiments obtaining similar vertically aligned $IrO_2$ nanorods show that, although these structures exhibit sharp tips, the crystal structure is amorphous or polycrystalline. The crystalline structure is a result of defects, or a high dislocation density, resulting from the fact that there is insufficient diffusion to overcome the effects of shadowing during growth, which acts to provide more precursor to the nanorod tips than to the nanorod stem, or rod bottom sections.

It would be advantageous if thin iridium oxide nanorods, referred to herein as nanowires, could be grown using a MOCVD process.

It would be advantageous if the above-mentioned nanowires could be grown without the use of a template.

It would be advantageous if the iridium oxide nanowires could be grown as a single-crystal structure.

SUMMARY OF THE INVENTION

This application describes $IrO_2$ nanowires grown on Ti, TiN, TaN and $SiO_2$ substrates. The growth length, density, and vertical orientation can be controlled by the choice of temperature, pressure, flow, substrate material, and time. Variations in the deposition process permit a very high aspect ratio $IrO_2$ nano wire to be grown, with a diameter of only 10-50 nanometers (nm), and a length as great as 1-2 um (microns). The nanowires obtained have good crystallinity and electrical properties.

Accordingly, a method is provided for forming iridium oxide (IrOx) nanowires. The method comprises: providing a growth promotion film with non-continuous surfaces, having a thickness in the range of 0.5 to 5 nanometers (nm), and made from a material such as Ti, Co, Ni, Au, Ta, polycrystalline silicon (poly-Si), or SiGe, to name a few examples; establishing a substrate temperature in the range of 200 to 600 degrees C.; introducing oxygen as a precursor reaction gas; introducing a (methylcyclopentadienyl)(1,5-cyclooctadiene)iridium(I) precursor; using a metalorganic chemical vapor deposition (MOCVD) process, growing IrOx nanowires from the growth promotion film surfaces.

In one aspect, prior to introducing the precursor, the growth promotion layer is annealed in an activation gas. The annealing temperature is in the range of 100 to 1000 degrees C. The activation gas can be O2, N2, Ar, or a forming gas. In a different aspect, prior to introducing the precursor, a base pressure is established in the range of $1 \times 10^{-8}$ to $1 \times 10^{-3}$ Torr; and the method subsequently establishes a final pressure in the range of 1 to 50 Torr. For example, oxygen can be added, increasing the base pressure to the final pressure; and, once the final pressure has been reached, the precursor is introduced. Alternately, oxygen and precursor are added simultaneously, increasing the base pressure to the final pressure.

The IrOx nanowires have a diameter in the range of 100 to 1000 Å, a length in the range of 1000 Å to 2 microns, an aspect ratio (length to width) of greater than 50:1. Further, the nanowires include single-crystal nanowire cores covered with an amorphous layer having a thickness of less than 10 Å.

Additional details of the above-described method and an iridium oxide nanowire electrical interconnect are described below.

BRIEF DESCRIPTION OF THE DRAWINGS

FIG. 1 is a partial cross-sectional view of an iridium oxide (IrOx) nanowire electrical interconnection.

FIG. 2 is a plan view of the nanowire electrical interconnection of FIG. 1.

FIG. 3 is a plan view of a first variation of the electrical interconnection of FIG. 1.

FIG. 4 is a plan view of a second variation of the electrical interconnection of FIG. 1.

FIG. 5 is a plan view of a third variation of the electrical interconnection of FIG. 1.

FIG. 7 is a cross-sectional view of the nanowire of FIG. 1.

FIG. 9 is a flowchart illustrating a method for forming iridium oxide (IrOx) nanowires.

FIG. 12 is a flowchart illustrating a second variation in the method for forming an IrOx nanowire electrical interconnect.

DETAILED DESCRIPTION

Figure 6:
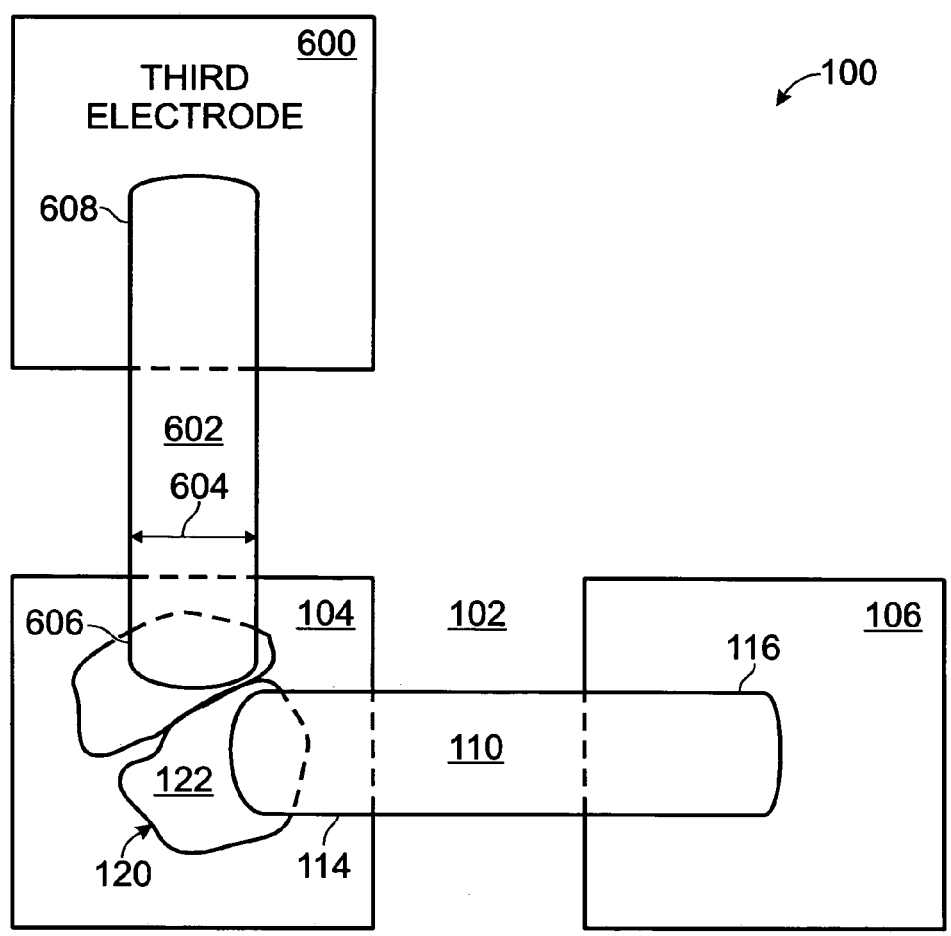
FIG. 6 is a plan view of a fourth variation of the electrical interconnection of FIG. 1.

FIG. 1 is a partial cross-sectional view of an iridium oxide (IrOx) nanowire electrical interconnection. The electrical interconnection 100 comprises a substrate 102, such as silicon or silicon oxide. A first electrically conductive electrode 104 and a second electrically conductive electrode 106 are formed on the substrate 102. The electrode material can be any conventional IC fabrication metal, metal oxide, or conductive semiconductor material. For example, the first and second electrodes 104/106 may be Ti, Co, Ni, Au, Ta, poly-Si, SiGe, Pt, Ir, TiN, or TaN.

An IrOx nanowire 110, with a diameter 112 of less than 1000 Å, has a proximal end 114 connected to the first electrode 104 and a distal end 116 connected to the second electrode 106. The value of "x" may be 2, in which case the Ir is completely oxidized, to values approaching zero, in which case the Ir is incompletely oxidized. In some aspects, the IrOx nanowire 110 has a diameter 112 in the range of 100 to 1000 Å. In other aspects, the IrOx nanowire 110 has a length 118 in the range of 1000 Å to 2 microns. Thus, the IrOx nanowire 110 has an aspect ratio (length to width) of greater than 50:1.

FIG. 2 is a plan view of the nanowire electrical interconnection of FIG. 1. Viewing FIGS. 1 and 2, it can be seen that a non-continuous growth promotion film region 120 has a surface 122 overlying the first electrode 104. The growth promotion film can be a material such as Ti, Co, Ni, Au, Ta, poly-Si, SiGe, Pt, Ir, TiN, or TaN. However, the invention is not necessarily limited to just these examples. The IrOx nanowire proximal end 114 is grown from the growth promotion film surface 122. The non-continuous growth promotion film region 120 has a thickness 124 in the range of 0.5 to 5 nanometers (nm).

FIG. 3 is a plan view of a first variation of the electrical interconnection of FIG. 1. In this aspect, a plurality of non-continuous growth promotion film regions 300 overlies the first electrode 104 and the second electrode 106. Three regions 300 are shown, the interconnection is not limited to any particular number. A plurality of nanowires 302 are grown from the plurality of growth promotion film regions 300.

FIG. 4 is a plan view of a second variation of the electrical interconnection of FIG. 1. A nucleation site 400 overlies the first electrode 104. The IrOx nanowire proximal end 114 is grown from the nucleation site 400. The nucleation site 400 can be a particle, a kink or irregularity in the surface of the electrode, or can result from matching crystal lattice constant lengths.

FIG. 5 is a plan view of a third variation of the electrical interconnection of FIG. 1. As in FIG. 3, a plurality of a IrOx nanowires 500 are shown, each having a proximal end 502 connected to the first electrode 104 and a distal end 504 connected to the second electrode 106. In this aspect, the interface between the nanowires 500 and the electrodes 104/106 is as alloy 506. The nanowires are deposited in a solvent, the nanowire solution spun onto the substrate, and the solvent evaporated. Then, an annealing process forms the interconnection alloy 506. The alloy 506 underlies the nanowires and is depicted in cross-hatching. The alloy 506 is understood to be a region where metals from the nanowire interdiffuse with metals form the electrode, forming an electrical and mechanical interconnection between the nanowire and the electrode.

FIG. 6 is a plan view of a fourth variation of the electrical interconnection of FIG. 1. Here, a third electrically conductive electrode 600 overlies the substrate 102. An IrOx nanowire 602, has a diameter 604 of less than 1000 Å, with a proximal end 606 connected to the first electrode 104 and a distal end 608 connected to the third electrode 600. Although three electrodes are shown, the interconnection is not limited to any particular number. Neither is the interconnection limited to any particular number of nanowires between electrodes.

FIG. 7 is a cross-sectional view of the nanowire 110 of FIG. 1. The nanowire 110 has a single-crystal nanowire core 700 covered with an amorphous layer 702 having a thickness 704 of less than 10 Å. Although the nanowire 110 is depicted as having a circular cross-section, in other aspects the nanowire may have a square, triangular, or oval shape. Further, is some aspects not shown, there may be a cavity or hollow region in the center of the core 700.

Figure 8A:
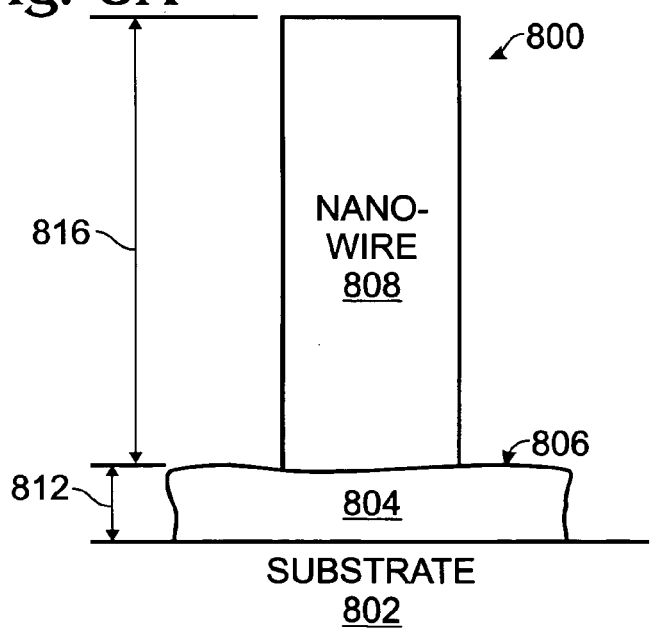
FIGS. 8A and 8B are partial cross-sectional and plan views, respectively, of an IrOx nanowire structure.
Figure 8B:
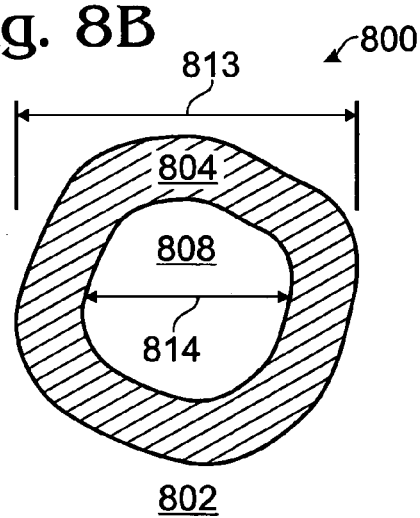

FIGS. 8A and 8B are partial cross-sectional and plan views, respectively, of an IrOx nanowire structure. The nanowire structure 800 comprises a substrate 802, such as Si or silicon oxide. A non-continuous growth promotion film 804 with a surface 806 overlies the substrate 802. IrOx nanowire 808 is shown, grown from the growth promotion film surface 806. The growth promotion film 804 has a thickness 812 in the range of 0.5 to 5 nanometers (nm), and is made from a material such as Ti, Co, Ni, Au, Ta, poly-Si, SiGe, Pt, Ir, TiN, or TaN. The non-continuous growth promotion film 804 has a size 813 in the range of 0.5 to 100 nm. Although the size 813 is shown as generally circular, the film 814 is not limited to any particular shape.

The IrOx nanowire 808 has a diameter 814 in the range of 100 to 1000 Å, and a length 816 in the range of 1000 Å to 2 microns. In one aspect, the IrOx nanowire 808 has an aspect ratio (length to width) of greater than 100:1. In another aspect, the aspect ratio is in the range of 50:1 to 100:1. As shown in FIG. 7, each IrOx nanowires includes a single-crystal nanowire core covered with an amorphous layer having a thickness of less than 10 Å.

Functional Description

IrOx nanowires have been successfully grown on TiN, TaN, Ti, Ta, and SiO2 substrates. (Methylcyclopentadienyl) (1,5-cyclooctadiene)iridium(I) is used as precursor. Both the precursor and the transport line are maintained at a constant temperature of 60-90° C. High purity oxygen at flow rate of 50-500 sccm can be used as carrier gas through an ampule of the Ir precursor. An additional pure oxygen line can be added to dilute the concentration of the precursor, or to increase the total flow rate of the precursor. A higher initial chamber pressure may also be used to enhance the nanotubes nucleation. Generally, a base pressure ($1 \times 10^{-8}$ to $1 \times 10^{-3}$ torr) is initially established to make the growth chamber as clean as possible. Then, the chamber is filled with, either oxygen only, or oxygen plus precursor to bring the pressure to the 1-50 torr range. A higher chamber pressure of 1-50 torr may also be maintained using the $O_2$ bypass line before inducing the precursor in order to enhance the nanowires nucleation.

The growth temperature in the chamber is from 200-600° C., and the pressure of the chamber is held at 1-50 torr during growth. Ni, Au, Ta can be used as the nanowire growth promotion layer with the thickness in the range of 0.5-5 nm. The growth promotion layer may be annealed in $O_2$, $N_2$, Ar, or forming gas at 100-1000° C., to active the promotion layer, enhancing the nanowire growth.

FIGS. 13A through 13H are photographs depicting the growth and formation of IrOx nanowires. The IrOx nanowires were formed on the broken area of Ti layer. The thickness of Ti layer is about 3 nm. Therefore the edge of the broken, non-continuous area may even be thinner than 3 nm. The length of the nanowire is a few microns and the diameter is about 1 nm to 50 nm. These SEM (scanning electron microscope) top views show that there is no nucleation on the Si area. There are large nucleation crystals on the continuous Ti area. IrOx nanowire is grown on the edge of the broken Ti area, seen in the photos as scratches.

FIG. 9 is a flowchart illustrating a method for forming iridium oxide (IrOx) nanowires. Although the method is depicted as a sequence of numbered steps for clarity, no order should be inferred from the numbering unless explicitly stated. It should be understood that some of these steps may be skipped, performed in parallel, or performed without the requirement of maintaining a strict order of sequence. The method starts at Step 900.

Step 902 provides a growth promotion film with non-continuous surfaces. Step 904 establishes a substrate temperature in the range of 200 to 600 degrees C. Step 906 introduces oxygen as a precursor reaction gas. For example, the oxygen flow rate can be in the range of 50 to 500 sccm. Step 908 establishes a final pressure. Step 910 introduces a (methylcyclopentadienyl)(1,5-cyclooctadiene)iridium(I) precursor. Step 912, using a metalorganic chemical vapor deposition (MOCVD) process, grows IrOx nanowires from the growth promotion film surfaces.

In one aspect, introducing the (methylcyclopentadienyl)(1,5-cyclooctadiene)iridium(I) precursor in Step 910 includes substeps. Step 910a initially heats the precursor to a first temperature in the range of 60 to 90 degrees C. Step 910b maintains the first temperature in the transport line introducing the precursor. Step 910c mixes the precursor with a carrier gas. For example, the precursor can be mixed with a carrier gas such as Ar or O2. In another aspect, Step 910c introduces the precursor and carrier gas at a flow rate in the range of 50 to 500 standard centimeter cube per minute (sccm).

In one aspect, providing a growth promotion film in Step 902 includes providing a growth promotion film having a thickness in the range of 0.5 to 5 nanometers (nm). Step 902 may provide a growth promotion film material such as Ti, Co, Ni, Au, Ta, poly-Si, SiGe, Pt, Ir, TiN, or TaN. In a different aspect, Step 902 provides a substrate with overlying growth promotion islands having a size in the range of 0.5 to 100 nm.

In one aspect, Step 909, prior to introducing the precursor in Step 910, anneals the growth promotion layer in an activation gas. For example, the growth promotion layer can be annealed at a temperature in the range of 100 to 1000 degrees C., using an activation gas such as O2, N2, Ar, or a forming gas. A forming gas includes nitrogen and 4 to 10% hydrogen. Note, Step 909 may be preformed before any oxygen is introduced into the chamber (Step 906).

In a different aspect, Step 905, prior to introducing the precursor in Step 910, establishes a base pressure in the range of $1 \times 10^{-8}$ to $1 \times 10^{-3}$ Torr. Then, Step 908 subsequently establishes a final pressure in the range of 1 to 50 Torr. In another aspect, introducing oxygen as a precursor reaction gas (Step 906) includes adding oxygen to increase the base pressure to a final pressure. Then, Step 910 introduces precursor after the final pressure has been reached. Alternately, oxygen and precursor are simultaneously added, increasing the base pressure to the final pressure. That is, Steps 906 and 910 are performed simultaneously.

In one aspect, growing IrOx nanowires from the growth promotion film surfaces in Step 912 includes growing nanowires having a diameter in the range of 100 to 1000 Å. In another aspect, Step 912 grows nanowires having a length in the range of 1000 Å to 2 microns. In a different aspect, Step 912 grows nanowires having an aspect ratio (length to width) of greater than 100:1. In another aspect the aspect ratio is in the range of 50:1 to 100:1. In yet another variation, Step 912 grows single-crystal nanowire cores covered with an amorphous layer having a thickness of less than 10 Å.

Figure 10:
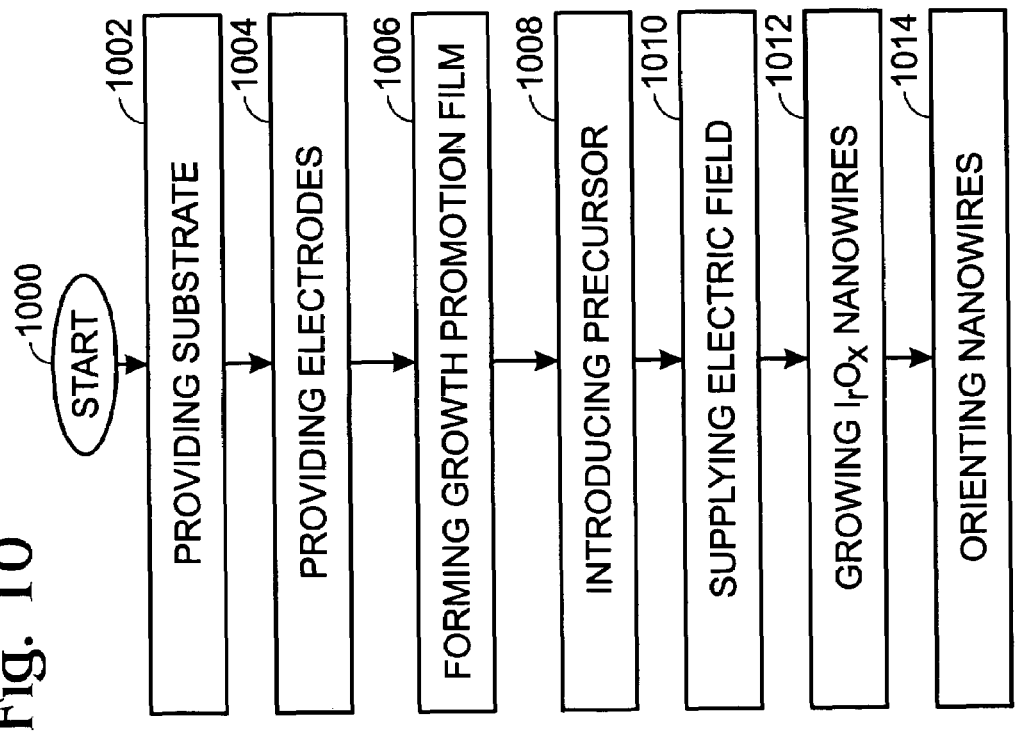
FIG. 10 is a flowchart illustrating a method for forming an IrOx nanowire electrical interconnect.
Figure 13A:
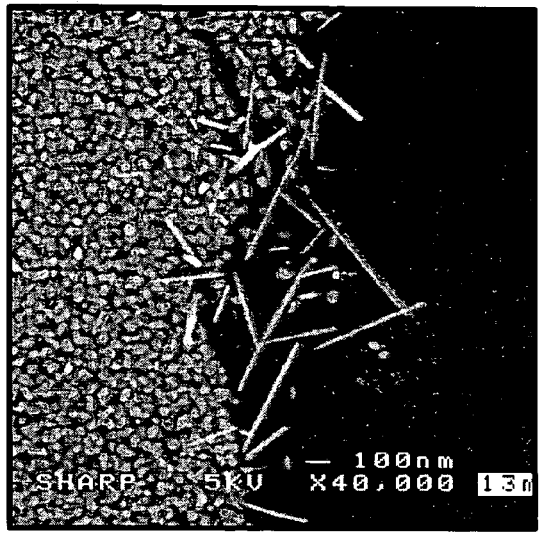
FIGS. 13A through 13H are photographs depicting the growth and formation of IrOx nanowires.
Figure 13B:
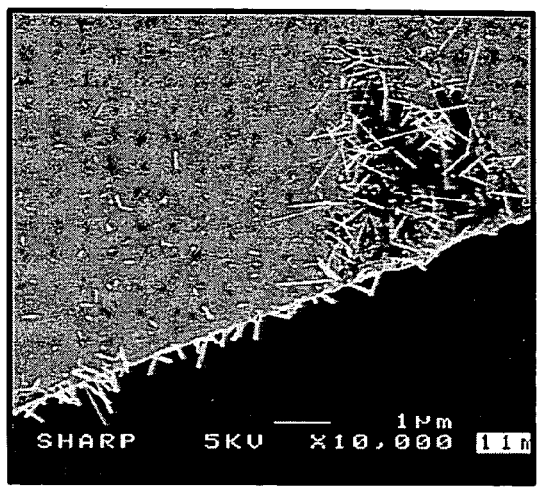
Figure 13C:
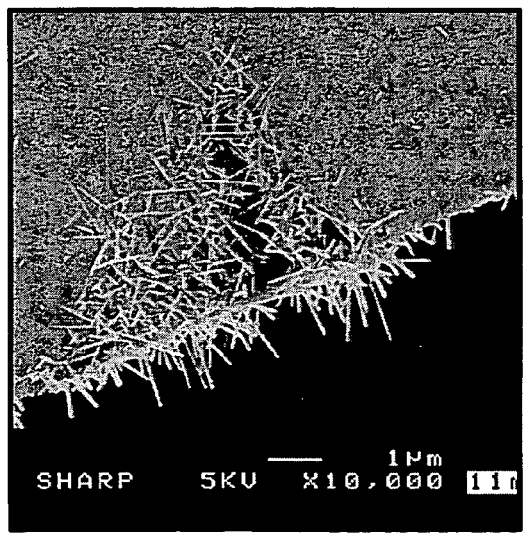
Figure 13D:
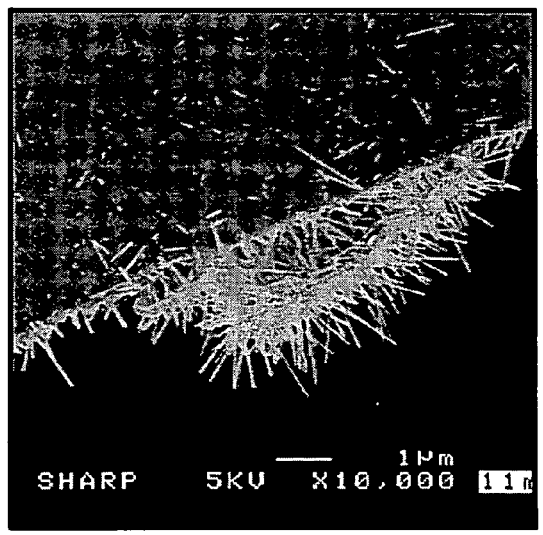
Figure 13E:
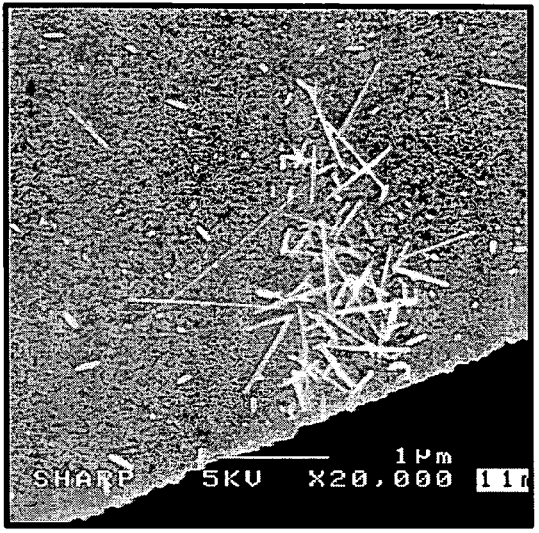
Figure 13F:
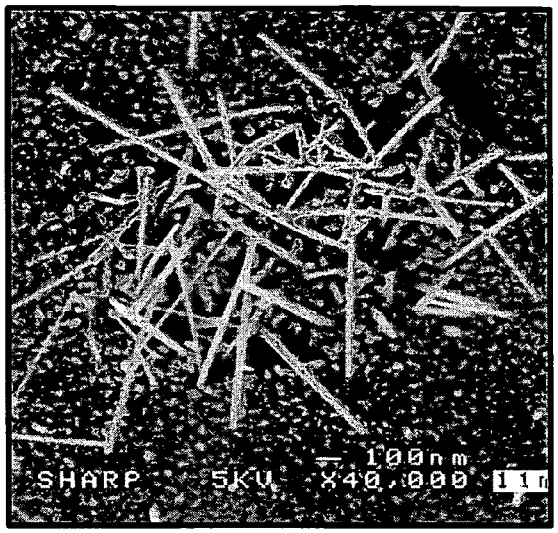
Figure 13G:
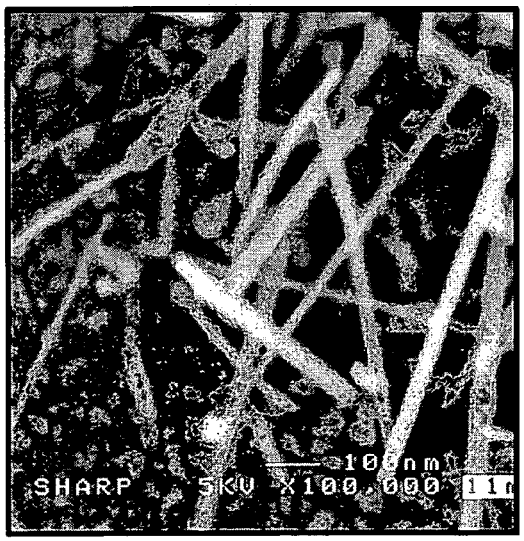
Figure 13H:
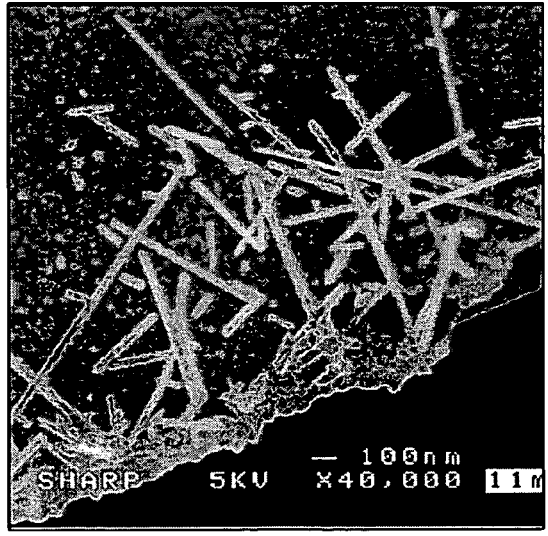

FIG. 10 is a flowchart illustrating a method for forming an IrOx nanowire electrical interconnect. The method starts at Step 1000. Step 1002 provides a substrate. Step 1004 provides a first and second electrically conductive electrode overlying the substrate. Step 1006 forms a growth promotion film with non-continuous surfaces overlying the first electrode. Step 1008 introduces a (methylcyclopentadienyl)(1,5-cyclooctadiene)iridium(I) precursor. Step 1010 supplies an electrical field between the first and second electrodes. Step 1012, using a metalorganic chemical vapor deposition (MOCVD) process, grows IrOx nanowires from the growth promotion film surface on the first electrode. Step 1014, in response to the electrical field, orients the growth of the IrOx nanowire toward to intersect the second electrode.

In one aspect, forming a growth promotion film overlying the first electrode in Step 1006 additionally includes forming growth promotion film with non-continuous surfaces overlying the first and second electrodes. Growing IrOx nanowires from the growth promotion film surface in Step 1012 includes growing the IrOx nanowires from the first and second electrodes. Then, Step 1014 orients the nanowires growing from the second electrode. For example, the direction of field flux may cause nanowires grown on the first electrode to "bend" in the direction of the second electrode.

Figure 11:
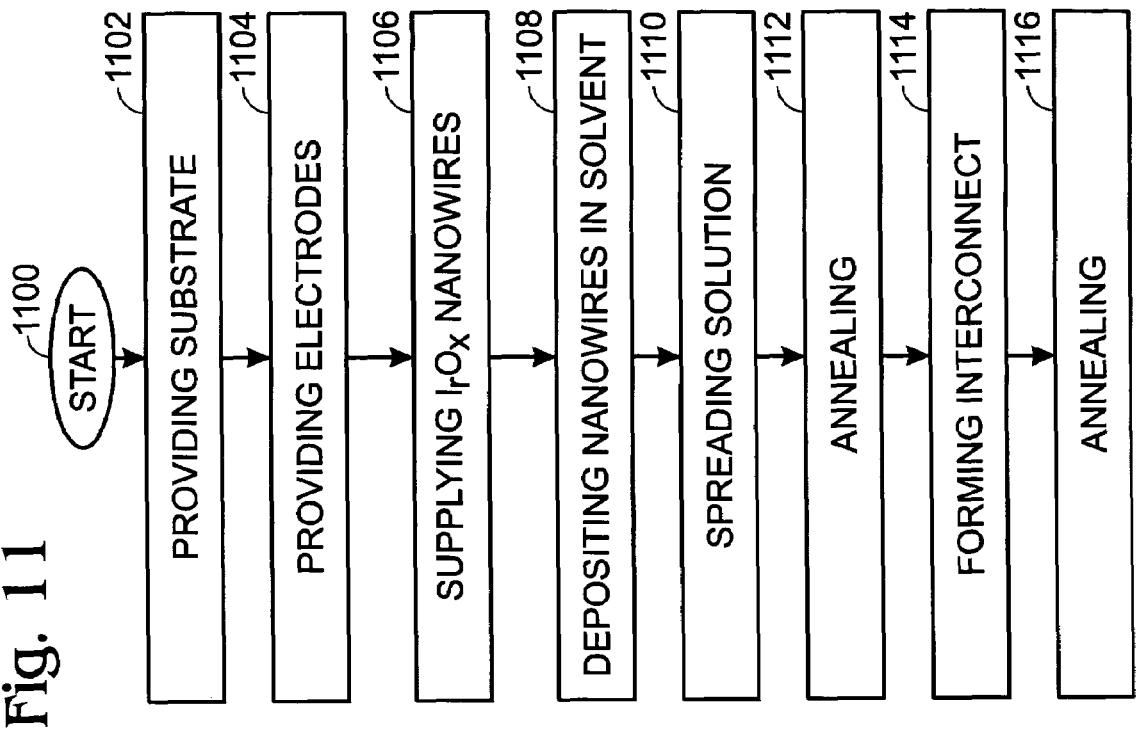
FIG. 11 is a flowchart illustrating another method for forming an IrOx nanowire electrical interconnect.

FIG. 11 is a flowchart illustrating another method for forming an IrOx nanowire electrical interconnect. The method starts at Step 1100. Step 1102 provides a substrate. Step 1104 provides a first and second electrically conductive electrode overlying the substrate. Step 1106 supplies a plurality of IrOx nanowires, each having a diameter of less than 1000 Å. Step 1108 deposits the IrOx nanowires in a solvent such as acetone or isopropyl alcohol (IPA). Step 1110 spreads the solution of nanowires over the substrate, covering the first and second electrodes. Step 1112 performs a first anneal to evaporate the solvent. For example, first annealing may be performed at a temperature less than 200° C., in an atmosphere such as N2, O2, a vacuum, Ar, or a forming gas. Step 1114 forms an IrOx nanowire electrical interconnection between the first and second electrodes. Step 1116 performs a second anneal, forming an alloy between the electrodes and the nanowire. For example, the second annealing may be performed at a temperature in the range of 200-1000° C., and in an atmosphere such as Ar, N2, O2, forming gas, or a vacuum.

FIG. 12 is a flowchart illustrating a second variation in the method for forming an IrOx nanowire electrical interconnect. The method starts at Step 1200. Step 1202 provides a substrate. Step 1204 supplies a plurality of IrOx nanowires, each having a diameter of less than 1000 Å. Step 1206 deposits the IrOx nanowires in a solvent, such as acetone or IPA, creating a nanowire solution. Step 1208 spreads or spins the nanowire solvent over the substrate. Step 1210 evaporates the nanowire solution. For example, Step 1210 may anneal at a temperature less than 200° C., in an atmosphere such as N2, O2, vacuum, Ar, or forming gas. Step 1212 deposits an electrically conductive film overlying the nanowire-covered substrate. The method is not limited to any particular conductive film material. Step 1214 patterns the electrically conductive film to form a first and a second electrode connected by an IrOx nanowire. In one aspect, Step 1216, following the patterning of the electrically conductive film, anneals at a temperature in the range of 200-1000° C. in an atmosphere such as Ar, N2, O2, forming gas, or a vacuum.

A method for forming an IrOx nanowire and a nanowire interconnection, as well as some IrOx nanowire structures have been provided. A few examples of process specifics and materials have used to illustrate the invention. However, the invention is not limited to just these examples. Other variations and embodiments of the invention will occur to those skilled in the art.

We claim:

1. A method for forming iridium oxide (IrOx) nanowires, the method comprising:
   providing a growth promotion film with non-continuous surfaces;
   introducing a (methylcyclopentadienyl)(1,5-cyclooctadiene)iridium(I) precursor; and
   using a metalorganic chemical vapor deposition (MOCVD) process, growing IrOx nanowires from the growth promotion film surfaces.

2. The method of claim 1 wherein introducing the (methylcyclopentadienyl)(1,5-cyclooctadiene)iridium(I) precursor includes:
   initially heating the precursor to a first temperature in the range of 60 to 90 degrees C.;
   maintaining the first temperature in the transport line introducing the precursor; and
   mixing the precursor with a carrier gas.

3. The method of claim 2 wherein mixing the precursor with a carrier gas includes mixing with a carrier gas selected from the group including Ar and O2.

4. The method of claim 2 wherein introducing the (methylcyclopentadienyl)(1,5-cyclooctadiene)iridium(I) precursor includes introducing the precursor and carrier gas at a flow rate in the range of 50 to 500 standard centimeter cube per minute (sccm).

5. The method of claim 1 further comprising:
   introducing oxygen as a precursor reaction gas.

6. The method of claim 4 wherein introducing oxygen includes introducing oxygen at a flow rate in the range of 50 to 500 sccm.

7. The method of claim 1 wherein providing a growth promotion film includes providing a growth promotion film having a thickness in the range of 0.5 to 5 nanometers (nm).

8. The method of claim 1 wherein providing a growth promotion film includes providing a growth promotion film material selected from the group including Ti, Co, Ni, Au, Ta, polycrystalline silicon (poly-Si), SiGe, Pt, Ir, TiN, and TaN.

9. The method of claim 1 further comprising:
   prior to introducing the precursor, annealing the growth promotion layer in an activation gas.

10. The method of claim 9 wherein annealing the growth promotion layer in an activation gas includes annealing at a temperature in the range of 100 to 1000 degrees C.

11. The method of claim 9 wherein annealing the growth promotion layer in an activation gas includes annealing in an activation gas selected from the group including O2, N2, Ar, and a forming gas.

12. The method of claim 5 further comprising:
   prior to introducing the precursor, establishing a base pressure in the range of $1 \times 10^{-8}$ to $1 \times 10^{-3}$ Torr.

13. The method of claim 5 further comprising:
   establishing a final pressure in the range of 1 to 50 Torr.

14. The method of claim 12 wherein introducing oxygen as a precursor reaction gas includes adding oxygen to increase the base pressure to a final pressure; and,
   wherein introducing precursor includes introducing precursor after the final pressure has been reached.

15. The method of claim 12 further comprising:
   simultaneously adding oxygen and precursor, increasing the base pressure to the final pressure.

16. The method of claim 1 further comprising:
   establishing a substrate temperature in the range of 200 to 600 degrees C.

17. The method of claim 1 wherein growing IrOx nanowires from the growth promotion film surfaces includes growing nanowires having a diameter in the range of 100 to 1000 Å.

18. The method of claim 1 wherein growing IrOx nanowires from the growth promotion film surfaces includes growing nanowires having an aspect ratio (length to width) of greater than 100:1.

19. The method of claim 1 wherein growing IrOx nanowires from the growth promotion film surfaces includes growing nanowires having an aspect ratio in the range of 50:1 to 100:1.

20. The method of claim 1 wherein growing IrOx nanowires from the growth promotion film surfaces includes growing nanowires having a length in the range of 1000 Å to 2 microns.

21. The method of claim 1 wherein growing IrOx nanowires from the growth promotion film surfaces includes growing single-crystal nanowire cores covered with an amorphous layer having a thickness of less than 10 Å.

22. The method of claim 1 wherein providing a growth promotion film with non-continuous surfaces includes providing a substrate with overlying growth promotion islands having a size in the range of 0.5 to 100 nm.

23. An iridium oxide (IrOx) nanowire structure comprising:
   a substrate;
   a non-continuous growth promotion film, with a surface, overlying the substrate; and
   IrOx nanowires grown from the growth promotion film surface.

24. The nanowire structure of claim 23 wherein the growth promotion film has a thickness in the range of 0.5 to 5 nanometers (nm).

25. The nanowire structure of claim 23 wherein the growth promotion film is made from a material selected from the group including Ti, Co, Ni, Au, Ta, polycrystalline silicon (poly-Si), SiGe, Pt, Ir, TiN, and TaN.

26. The nanowire structure of claim 23 wherein the IrOx nanowires have diameters in the range of 100 to 1000 Å.

27. The nanowire structure of claim 23 wherein the IrOx nanowires have an aspect ratio (length to width) of greater than 100:1.

28. The nanowire structure of claim 23 wherein the IrOx nanowires have an aspect ratio in the range of 50:1 to 100:1.

29. The nanowire structure of claim 23 wherein the IrOx nanowires have a lengths in the range of 1000 Å to 2 microns.

30. The nanowire structure of claim 23 wherein each IrOx nanowires includes a single-crystal nanowire core covered with an amorphous layer having a thickness of less than 10 Å.

31. The nanowire structure of claim 23 wherein the non-continuous growth promotion film has a size in the range of 0.5 to 100 nm.

32. An iridium oxide (IrOx) nanowire electrical interconnection comprising:
a substrate;
a first electrically conductive electrode formed on the substrate;
a second electrically conductive electrode formed on the substrate; and
an IrOx nanowire having a diameter of less than 1000 Å, with a proximal end connected to the first electrode and a distal end connected to the second electrode.

33. The nanowire electrical connection of claim 32 further comprising:
a non-continuous growth promotion film region with a surface overlying the first electrode; and
wherein the IrOx nanowire proximal end is grown from the growth promotion film surface.

34. The electrical interconnection of claim 32 wherein the non-continuous growth promotion film region has a thickness in the range of 0.5 to 5 nanometers (nm).

35. The electrical connection of claim 34 wherein a plurality of non-continuous growth promotion film regions overlie the first electrode and the second electrode; and
wherein a plurality of nanowires are grown from the plurality of growth promotion film regions.

36. The electrical interconnection of claim 33 wherein thegrowth promotion film is made from a material selected from the groupincluding Ti, Co, Ni, Au, Ta, polycrystalline silicon (poly-Si), SiGe, Pt, Ir, TiN, and TaN.

37. The electrical interconnection of claim 32 wherein the first electrode is a material selected from the group including Ti, Co, Ni, Au, Ta, poly-Si, SiGe, Pt, Ir, TiN, and TaN;
the electrical interconnection further comprising:
a nucleation site overlying the first electrode; and
wherein the IrOx nanowire proximal end is grown from the nucleation site.

38. The electrical interconnection of claim 32 wherein the IrOx nanowire has a diameter in the range of 100 to 1000 Å.

39. The electrical interconnection of claim 32 wherein the IrOx nanowire has an aspect ratio (length to width) of greater than 50:1.

40. The electrical interconnection of claim 32 wherein the IrOx nanowire has a length in the range of 1000 Å to 2 microns.

41. The electrical interconnection of claim 32 wherein the IrOx nanowire includes a single-crystal nanowire core covered with an amorphous layer having a thickness of less than 10 Å.

42. The electrical interconnection of claim 32 further comprising:
a plurality of a IrOx nanowires, each having a proximal end connected to the first electrode and a distal end connected to the second electrode.

43. The electrical interconnection of claim 32 further comprising:
a third electrically conductive electrode overlying the substrate; and
an IrOx nanowire having a diameter of less than 1000 Å, with a proximal end connected to the first electrode and a distal end connected to the third electrode.

44. The electrical interconnection of claim 32 further comprising:
an alloy, formed as a result of annealing, connecting the nanowire to the first and second electrodes.

45. A method for forming an iridium oxide (IrOx) nanowire electrical interconnect, the method comprising:
providing a substrate;
providing a first and second electrically conductive electrode overlying the substrate;
supplying a plurality of IrOx nanowires, each having a diameter of less than 1000 Å;
depositing the IrOx nanowires in a solvent;
spreading the solution of nanowires over the substrate, covering the first and second electrodes;
performing a first anneal to evaporate the solvent;
forming an IrOx nanowire electrical interconnection between the first and second electrodes; and
performing a second anneal, forming an alloy between the electrodes and the nanowire.

46. The method of claim 45 wherein depositing the IrOx nanowires in a solvent includes depositing the nanowires in a solvent selected from the group including acetone and isopropyl alcohol (IPA);
wherein performing a first anneal includes annealing at a temperature less than 200° C., in an atmosphere selected from the group including N2, O2, vacuum, Ar, and forming gas; and
wherein performing a second anneal includes annealing at a temperature in the range of 200-1000° C. in an atmosphere selected from the group including Ar, N2, O2, forming gas, and a vacuum.

47. A method for forming an iridium oxide (IrOx) nanowire electrical interconnect, the method comprising:
providing a substrate;
supplying a plurality of IrOx nanowires, each having a diameter of less than 1000 Å;
depositing the IrOx nanowires in a solvent, creating a nanowire solution;
spreading the nanowire solvent over the substrate;
evaporating the nanowire solution;
depositing an electrically conductive film overlying the nanowire-covered substrate;
patterning the electrically conductive film to form a first and a second electrode connected by an IrOx nanowire.

48. The method of claim 47 wherein depositing the IrOx nanowires in a solvent includes depositing the nanowires in a solvent selected from the group including acetone and isopropyl alcohol (IPA);
wherein evaporating the nanowire solution includes annealing at a temperature less than 200° C., in an atmosphere selected from the group including N2, O2, vacuum, Ar, and forming gas.

49. The method of claim 47 further comprising:
following the patterning of the electrically conductive film, annealing at a temperature in the range of 200-1000° C. in an atmosphere selected from the group including Ar, N2, O2, forming gas, and a vacuum.

50. A method for forming an iridium oxide (IrOx) nanowire electrical interconnect, the method comprising:
providing a substrate;
providing a first and second electrically conductive electrode overlying the substrate;

forming a growth promotion film with non-continuous surfaces overlying the first electrode;
introducing a (methylcyclopentadienyl)(1,5-cyclooctadiene)iridium(I) precursor;
supplying an electrical field between the first and second electrodes;
using a metalorganic chemical vapor deposition (MOCVD) process, growing IrOx nanowires from the growth promotion film surface on the first electrode; and
in response to the electrical field, orienting the growth of the IrOx nanowires toward to intersect the second electrode.

51. The method of claim 50 wherein forming a growth promotion film overlying the first electrode additionally includes forming growth promotion film with non-continuous surfaces overlyingthe first and second electrodes;
- wherein growing IrOx nanowires from the growth promotion film surface includes growing the IrOx nanowires from the first and second electrodes; and
- wherein orienting the growth of the IrOx nanowire additionally includes orienting the second electrode nanowires.

* * * * *